United States Patent [19]

Cherukuri

[11] Patent Number: 5,047,371
[45] Date of Patent: * Sep. 10, 1991

[54] GLASS/CERAMIC SEALING SYSTEM

[75] Inventor: Satyam C. Cherukuri, Northford, Conn.

[73] Assignee: Olin Corporation, New Haven, Conn.

[*] Notice: The portion of the term of this patent subsequent to Aug. 28, 2007 has been disclaimed.

[21] Appl. No.: 239,891

[22] Filed: Sep. 2, 1988

[51] Int. Cl.$^5$ .................. C03C 8/02; C03C 10/04; C03C 2/118; C03C 3/078

[52] U.S. Cl. .................................. 501/21; 501/5; 501/22; 501/26; 501/60; 501/61; 501/62; 501/63; 501/65; 501/66; 501/67; 501/68; 501/69; 501/72

[58] Field of Search .............. 501/69, 72, 21, 22, 501/26, 60, 61, 62, 63, 65, 66, 67, 68, 5

[56] References Cited

U.S. PATENT DOCUMENTS

| | | |
|---|---|---|
| 2,446,277 | 8/1948 | Gordon . |
| 2,515,941 | 7/1950 | Stookey ................................ 501/69 |
| 2,948,992 | 8/1960 | Oldfield et al. ...................... 501/69 |
| 3,063,198 | 11/1962 | Babcock .............................. 501/69 |
| 3,341,369 | 3/1965 | Caule et al. . |
| 3,407,091 | 10/1968 | Busdiecker . |
| 3,473,999 | 10/1969 | Muchow ............................... 65/59 |
| 3,475,227 | 10/1969 | Caule et al. . |
| 3,498,803 | 3/1970 | Stookey ............................... 501/72 |
| 3,522,039 | 7/1970 | Alton . |
| 3,804,703 | 4/1974 | Hirayama . |
| 3,808,154 | 4/1974 | Omori ................................. 501/69 |
| 3,826,627 | 7/1974 | Pryor et al. . |
| 3,826,629 | 7/1974 | Pryor et al. . |
| 3,939,295 | 2/1976 | Robertson et al. .................. 501/69 |
| 4,185,139 | 1/1980 | Smernos . |
| 4,434,016 | 2/1984 | Saleh et al. . |
| 4,472,030 | 9/1984 | Tachibawa et al. ................. 501/72 |
| 4,491,622 | 1/1985 | Butt . |
| 4,524,238 | 6/1985 | Butt . |
| 4,594,221 | 6/1986 | Caron et al. . |
| 4,605,532 | 8/1986 | Knorr et al. . |
| 4,656,499 | 4/1987 | Butt . |
| 4,704,626 | 11/1987 | Mahulikar et al. . |
| 4,712,161 | 12/1987 | Pryor et al. . |
| 4,732,794 | 3/1988 | Hyde ................................... 501/72 |

FOREIGN PATENT DOCUMENTS 817636 8/1959 United Kingdom .

Primary Examiner—Mark L. Bell
Attorney, Agent, or Firm—Gregory S. Rosenblatt; Paul Weinstein

[57] ABSTRACT

The present invention relates to a glass/ceramic sealing system. A sealing glass having a coefficient of thermal expansion in excess of $160 \times 10^{-7}$ in/in/° C. is provided. The glass is useful for matched sealing of copper and copper based alloys. The glass is capable of ceramization, greatly increasing the resistance of the glass to moisture penetration and fracture due to mechanical damage. The temperature of ceramization has been designed so that a solutionized copper alloy leadframe is age hardened during ceramization. The glass has particular utility in the manufacture of electronic packages and multi-layer circuitry.

10 Claims, 1 Drawing Sheet

GLASS/CERAMIC SEALING SYSTEM

This invention relates to a glass-ceramic sealing systems The coefficient of thermal expansion of the sealing system may be matched to that of copper and copper based alloys The sealing system is further strongly resistant to moisture penetration and to fracture due to mechanical shock. The sealing system is particularly useful to bond metal electronic packages as well as electrical connectors.

There are many metal-glass-ceramic applications and systems which have in common the bonding of a glass or ceramic material to the surface of a metal. One common application is in the manufacture of hermetic packages designed to enclose electronic devices such as silicon semiconductor devices.

Perhaps the most common hermetic package is the ceramic dual in line package commonly known as the CERDIP. The package contains a base component and a cover component made of aluminum oxide. The components are joined together, frequently with a metal leadframe disposed between, by a sealing glass. The glass is fabricated to have a coefficient of thermal expansion approximating that of the aluminum oxide components, about $49 \times 10^{-7}$ in/in/° C.

As semiconductor technology developed, the electronic devices became more complex. More electronic circuitry was positioned on smaller surface areas and as a result, the electronic device generated more heat during operation. Aluminum oxide has insufficient thermal conductivity to prevent the device from overheating so alternatives to the CERDIP were developed.

Among the alternatives was the metal package. A metal or metal alloy replaced the aluminum oxide as the base and cover components of the package Initially, low expansion alloys such as the iron-nickel-cobalt alloy known by the trademark KOVAR or low expansion metals such as molybdenum were used. Sealing glasses used for sealing CERDIP packages were adapted to the metal packages. To increase adhesion of the glass to the metal components, a thin layer of a metal oxide was formed on the surface of the base and cover components in accordance with technology known from the fabrication of glass to metal seals for the vacuum tube industry.

A glass suitable for bonding to molybdenum (coefficient of thermal expansion $= 49 \times 10^{-7}$ in/in/° C.) containing $SiO_2$, $Al_2O_3$, MgO, $ZrO_2$, $TiO_2$ and $Li_2O$ is disclosed in U.S. Pat. No. 3,473,999 to Mochow.

As semiconductor devices continued to increase in complexity, the need for package components with improved thermal conductivity also increased. Typically, there is a correlation between the thermal conductivity and the coefficient of thermal expansion of a material. As the thermal conductivity increases, the coefficient of thermal conductivity likewise increases Therefore, the higher thermal conductivity electronic packages require a sealing glass with a higher coefficient of thermal expansion.

A sealing glass for stainless steel having a coefficient of thermal expansion of $120 \times 10^{-7} - 140 \times 10^{-7}$ in/in/° C. containing $SiO_2$, $K_2O$, $Na_2O$, $Al_2O_3$ and MgO is disclosed in U.S Pat. No. 3,804,703 to Hirayama.

A sealing glass for nickel having a coefficient of thermal expansion of about $150 \times 10^{-7}$ in/in/° C. and containing $SiO_2$, $Na_2O$, $K_2O$, a mixture of (BaO,SrO and CaO) and $Al_2O_3$ is disclosed in U.S. Pat. No. 2,948,992 to Oldfield. Yet another relatively high expansion glass is known by the trademark CORNING 1990 and sold by Corning Glass Works located in Corning, N.Y. This glass contains $SiO_2$, $Li_2O$, $Na_2O$, $K_2O$ and PbO and has a coefficient of thermal expansion of about $136 \times 10^{-7}$ in/in/° C.

To maximize thermal conductivity, package components made from copper or copper base alloys are preferred. The coefficient of thermal expansion of these materials is in the range of from about $160 \times 10^{-7}$ to about $180 \times 10^{-7}$ in/in/° C. Glasses with coefficients of thermal expansion in the same range were required Glasses have been developed which are close to the coefficient of thermal expansion of copper. For example, U.S. Pat. No. 3,407,091 to Busdiecker discloses a glass containing $Al_2O_3$, $K_2O$, ZnO and $P_2O_5$ for sealing to copper or copper alloys. The coefficient of thermal expansion of this glass was measured to be $141 \times 10^{-7}$ in/in/° C. However, if the mismatch between the glass and the substrate is much greater than about 10%, it has been found the glass will develop microcracks and hermeticity of the package will be lost.

Sealing glasses with coefficients of thermal expansion approximating that of copper have been made by adding a filler with a high coefficient of thermal expansion, such as calcium fluoride, to a sealing glass. U S. Pat. No. 4,185,139 to Smermos as well as U.S. Pat. No. 4,775,647 to Smith and U.S. Pat. No. 4,818,730 to Smith et al. disclose the use of a filler.

A problem with a filler is excessive amounts of filler lead to a deterioration of the rheological properties and can affect seal integrity. Also, as the sealing glass is heated, some of the filler is dissolved. Dissolution of filler may lead to outgassing. One approach to the problem of excessive dissolution is coating the filler as shown in U.S. Pat. No. 4,185,139 to Smermos. However, coating is difficult and does not solve the problem of excessive filler.

A homogeneous sealing glass which has a coefficient of thermal expansion matching that of copper and copper based alloys which does not require the addition of a filler is disclosed in U.S. Pat. No. 169,635 by Cherukuri This sealing glass consists essentially of at least fifty molar percent $SiO_2$; from about ten to about twenty molar percent BaO; from about twenty to about thirty molar percent of an alkaline oxide component, the alkaline oxide component is comprised of at least two alkaline oxides selected from the group consisting of $Na_2O$, $K_2O$ and $Li_2O$; up to about five molar percent $Al_2O_3$; and up to ten molar percent of an additive.

In accordance with the present invention, a sealing system comprising a glass-ceramic material is provided. The glass-ceramic has a coefficient of thermal expansion approximately matching that of copper or copper based alloys. The sealing material is supplied as a glass and is capable of ceramization. Ceramization is the nucleation and growth of one or more crystalline phases from a non-crystalline matrix. The glass-ceramic exhibits improved resistance to moisture as well as chemical corrosion. It is further more resistant to mechanical shock than conventional sealing glasses. The glass-ceramic of the invention is a homogeneous mixture consisting essentially of the following elements in approximately the following ratio:

| | |
|---|---|
| $SiO_2$ | at least about 40 molar percent. |

-continued

| | |
|---|---|
| BaO | from about 5 molar percent to about 25 molar percent |
| alkaline oxide | combination of at least two, the combination being from about 15 molar percent to about 45 molar percent. |
| $V_2O_5$ | from about 0.1 molar percent to about 5 molar percent. |
| ZnO | up to about 15 molar percent. |
| PbO | up to about 10 molar percent. |
| $Al_2O_3$ | up to about 5 molar percent. |
| additives | up to about 10 molar percent. |

The glass is sealed at temperatures of from about 780° C. to about 850° C. without deterioration. High temperature stability permits the assembly of age hardenable copper alloy packages which may be thermally treated subsequent to sealing Following glass sealing, the glass is partially converted into a ceramic by heat treating at a temperature of from about 550° C. to about 750° C. After ceramization, it is preferable to anneal the glass-ceramic at a temperature of from about 350° C. to about 500° C. In one embodiment, the copper alloy packaging components are selected to be age hardenable during the glass-ceramic annealing step.

It is an object of the present invention to provide a sealing system having a coefficient of thermal expansion approximately equal to that of copper or a copper based alloy.

It is another object of the invention to provide a sealing system having improved moisture resistance.

It is another feature of the invention to provide a sealing system having improved resistance to mechanical shock.

It is a feature of the invention that the glass is homogeneous and free of undissolved or partially dissolved fillers.

It is another feature of the invention that the sealing system comprises a sealing glass capable of ceramization It is a feature of the invention that the glass has a sealing temperature of about 800° C. and is suitable for the sealing of metal or metal alloy packages designed to house electronic devices.

It is an advantage of the present invention that the glass crystallizes at a temperature suitable for age hardening the metal alloy components.

Accordingly, there is provided a ceramicizable sealing glass having a coefficient of thermal expansion approximately matching that of copper or copper based alloys. The glass-ceramic is annealed at a temperature which promotes age hardening of precipitation hardenable copper alloys The glass-ceramic is particularly suitable to bond copper or copper alloy components of hermetic electronic packages.

These and other advantages will become more apparent from the following description and drawings.

Figure 1:
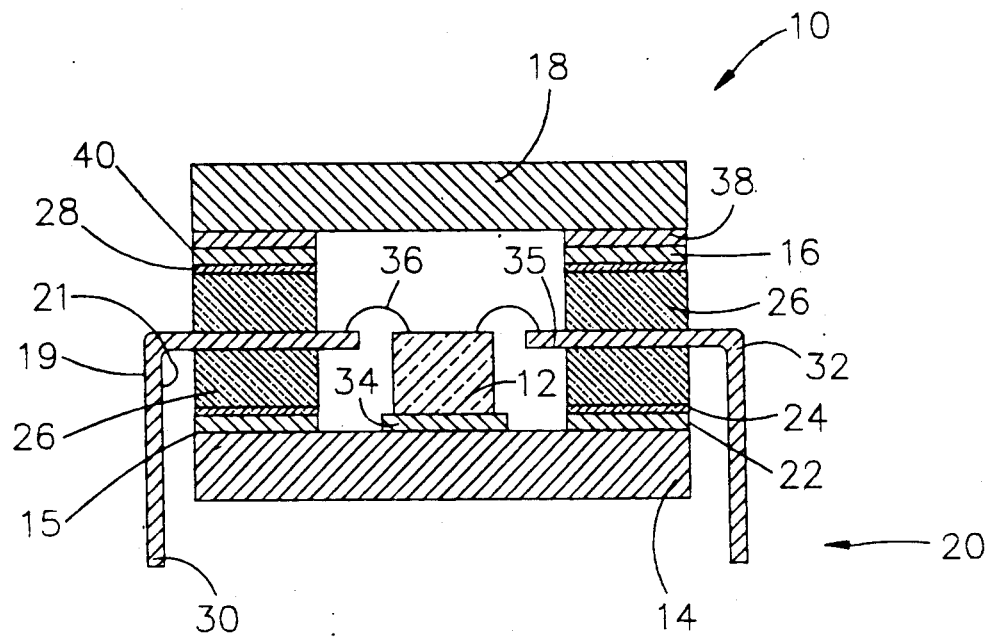
FIG. 1 shows in cross section an electronic package manufactured in accordance with the invention.

The invention relates to sealing glasses capable of ceramization The glasses are characterized by a coefficient of thermal expansion approximately matching a metal or metal alloy, preferably that of copper or a copper based alloy. Preferably, the coefficient of thermal expansion is in the range of from about $160 \times 10^{-7}$ in/in/° C. to about $180 \times 10^{-7}$ in/in/° C. and, most preferably, in the range of from about $165 \times 10^{-7}$ in/in/° C. to about $175 \times 10^{-7}$ in/in/° C.

The glasses are further preferably homogeneous, that is, without any undissolved fillers or other media present.

The glasses are preferably sodium free which has been found to improve moisture resistance.

In a preferred composition, the glass contains $SiO_2$, BaO, $Li_2O$, $K_2O$, and $V_2O_5$.

The glass is predominantly comprised of silicon dioxide, at least about 40 molar percent. More preferably, the concentration of $SiO_2$ is from about 40 molar percent to about 50 molar percent and, most preferably, the concentration is from about 45 molar percent to about 48 molar percent.

The barium oxide component is preferably present in concentrations of from about five molar percent to about twenty five molar percent. Barium oxide is a major contributor to the thermal expansion coefficient of the glass composite. The desired concentration of BaO is determined by the coefficient of thermal expansion of the metal alloy which is being sealed. For most copper or copper based alloys, a BaO concentration of from about ten molar percent to about twenty molar percent is preferred Twelve to about fifteen molar percent is most preferred.

A combination of alkaline oxides is added to the glass. These alkaline oxides increase the coefficient of thermal expansion of the glass as well as improve moisture resistance. Preferred alkaline oxides are lithium oxide and potassium oxide. Other suitable alkaline oxides are $Rb_2O_3$ and $Cs_2O_3$. Sodium oxide ($Na_2O$) is not preferred as the inclusion of greater than about 5 molar percent of this oxide makes the glass susceptible to moisture penetration Lithium oxide is preferable supplied in a concentration of from about 5 molar percent to about 15 molar percent and most preferably in a concentration of from about 6 molar percent to about 9 molar percent.

Potassium oxide is supplied in a preferred concentration of from about 10 molar percent to about 30 molar percent and most preferably in a concentration of from about 18 molar percent to about 22 molar percent.

A final constituent of the sealing glass is a nucleating agent, preferably vanadium oxide ($V_2O_5$). Vanadium oxide has been found to improve the adhesion of the sealing glass to the metal alloy substrate and further acts as a nucleating site to promote ceramization.

The preferred concentration of vanadium oxide is in the range of from about 0.1 molar percent to about 5 molar percent. The most preferred concentration of vanadium oxide is in the range of from about 0.3 molar percent to about 0.8 molar percent Phosphorous oxide ($P_2O_5$) in about the same concentrations as the vanadium oxide has also been found to act as a nucleating agent to promote ceramization. Certain additives including lead oxide (PbO), zinc oxide (ZnO) and aluminum oxide ($Al_2O_3$) are desirable. Lead oxide adjusts the melting point of the sealing glass.

Increasing the concentration of lead oxide decreases the sealing temperature of the glass. The oxide has been found to increase the moisture resistance of the residual matrix. The lead oxide concentration is preferably in the range of up to about 10 molar percent A most preferred concentration is from about 4 molar percent to about 6 molar percent. The concentration is preferably kept below about 6 molar percent. Sealing glasses containing higher concentrations of lead oxide often require an oxidizing atmosphere for sealing. The choice of copper alloy substrates for the metal package often mandates sealing in a reducing or neutral atmosphere.

Zinc oxide both improves the moisture resistance of the residual glass phase and facilitates the precipitation of the crystalline ceramic phase. The concentration of the zinc oxide additive is preferably up to about 15 molar percent. A most preferred zinc oxide concentration is in the range of from about 6 molar percent to about 8 molar percent Preferably, a small amount of aluminum oxide is also added to the glass It has been found that aluminum oxide increases the chemical resistance of the residual glass phase. Aluminum oxide lowers the coefficient of thermal expansion of the sealing glass. It is preferred to maintain the aluminum oxide concentration to less than about 5 molar percent. Most preferably, the $Al_2O_3$ concentration is from about 1 molar percent to about 3 molar percent Various other additives may be combined with the glass, generally in concentrations of less than about 10 molar percent Additives which may be combined with the sealing glass include, but are not limited to $B_2O_3$, CaO, NiO, $TiO_2$ and SrO.

As an illustrative example, which is not intended to limit the invention, the following sealing glass composition has been found to give a coefficient of thermal expansion of $167 \times 10^{-7}$ in/in/° C. The sealing glass readily precipitates a ceramic phase upon heat treating. The resulting glass-ceramic is characterized by good chemical and moisture resistance as well as resistance to fracture resulting from mechanical shock.

| Oxide | Molar % | Weight % |
| --- | --- | --- |
| $SiO_2$ | 45.9 | 31.64 |
| PbO | 4.6 | 11.78 |
| BaO | 13.0 | 22.87 |
| ZnO | 7.2 | 6.72 |
| $Li_2O$ | 7.3 | 2.5 |
| $K_2O$ | 19.1 | 20.64 |
| $Al_2O_3$ | 2.4 | 2.81 |
| $V_2O_5$ | 0.5 | 1.04 |

The glass is formed by combining the proper ratio of desired source materials The source materials which are usually the oxides or carbonates of the desired elements are generally supplied in powder form with a particle size of about 5 microns. The dry powders are mixed well, for example by vibratory mixing to insure a homogeneous glass. The powder mixture is then heated to a temperature in the range of from about 1300° C. to about 1500° C. and most preferably at a temperature of from about 1325° C. to about 1375° C.

The molten glass is cooled to room temperature rapidly, as by a water quench. The glass is reduced to a powder having a particulate size of from about 5 microns to about 10 microns by a process such as attrition.

The glass powder is mixed with an organic solvent such as terpinol to facilitate application of the sealing glass to a substrate. Application of the glass/solvent mixture is frequently done by screen printing although any process known in the art is acceptable.

The glass/solvent is then glazed by heating to a temperature of from about 600° C. to about 750° C. in air for a time in the range of from about 15 minutes to about 30 minutes. Glazing evaporates the binder as well as causes glass particulate to sinter and loosely bond to adjoining glass particulate as well as to the metal substrate.

Following glazing, the glass is sealed. Glass sealing is at a temperature above about 750° C. and most preferably in the range of from about 780° C. to about 850° C. The high temperature of glass sealing results in solutionizing of precipitation hardenable components of a metal package or other device being bonded. Solutionizing is when the alloy precipitates dissolve into the copper matrix producing a soft, ductile material. For example, after glass sealing a precipitation hardened leadframe would be in the solutionized state and may be easily bent to a desired radius. The more easily the leadframe may be bent, the less likely damage to the glass seal during lead bending prebent leadframes, in which the leads are bent to a desired radius prior to glass sealing may also be used.

The glass is next subjected to a ceramization step. Ceramization is the nucleation and growth of one or more crystalline phases from a non-crystalline matrix. Crystallization may be initiated by subjecting the glass to a heat treatment in the range of from about 550° C. to about 750° C. for a time in the range of from about 15 minutes to about 90 minutes. Most preferably, the ceramization step occurs at from about 600° C. to about 650° C. for a time of from about 20 minutes to about 40 minutes. This time and temperature range is particularly desirable. The preferred precipitation hardenable copper alloys age in the same temperature and time range. When a solutionized precipitation hardened alloy ages, an alloy component precipitates from the copper matrix producing the precipitation hardened alloy. For example, a solutionized leadframe manufactured from copper alloy CDA 724 has a tensile strength of 60 ksi and may be easily bent. After aging, the same leadframe has a tensile strength of 100 ksi and is resistant to bending from handling The use of precipitation hardened copper alloys as package components has been disclosed in U.S. Pat. No. 4,805,009 filed Mar. 11, 1985 by Pryor et al. The use of a precipitation hardenable copper alloy leadframe which is assembled in a package in the solutionized state and then age hardened during glass sealing is disclosed in U.S. Pat. Application Ser. No. 2,532, filed Jan. 12, 1987 by Mahulikar et al.

It is desirable to anneal the glass-ceramic after ceramization A preferred annealing process is to heat the glass-ceramic to a temperature of from about 350° C. to about 450° .C for a time of from about 15 minutes to about 45 minutes. A most preferred annealing process is to heat the glass to a temperature of from about 390° C. to about 420° C. for about 25 minutes to about 35 minutes.

The advantages of this glass-ceramic sealing system will become more apparent from the following examples demonstrating the use of the system in electronic devices.

EXAMPLE 1

The preferred glass has a sealing temperature in excess of about 750° C. Elevated sealing temperature glasses are particularly suited for the manufacture of "window frame" packages as described hereinbelow.

FIG. 1 illustrates in cross section a hermetic metal package 10 adapted to house an electronic device 12, usually a silicon based semiconductor Hermetic metal packages are disclosed in U.S. Pat. No. 4,524,238 to Butt and U.S. Pat. No. 4,656,499 to Butt and both are hereby incorporated by reference in the present application.

The package 10 is comprised of a base component 14, a window frame 16 and a cover component 18. A leadframe 20 is disposed between the window frame 16 and base component 14 and serves to electrically connect the electronic device 12 to external circuitry.

While metal or metal alloys may be used to manufacture the package components, copper alloys which form refractory oxides are preferred. Alloys which form a surface refractory oxide when heated in an oxidizing atmosphere are referred to herein as alloys which form a glass sealable layer "in situ".

Other alloys may be coated with a glass sealable oxide forming metal or metal alloy by cladding. Plating, vapor deposition or sputtering as disclosed in U.S. Pat. No. 4,796,083 filed on July 2, 1987, by Cherukuri et al. may also be used. The process is referred to herein as forming a glass sealable layer by an "additive" process.

Preferred copper alloys include alloys 638, 724 and 7025. Alloy 638 contains 2.5–3.1% aluminum, 1.5–2.1% silicon and the balance copper as described in U.S. Pat. Nos. 3,341,369 and 3,475,227 issued to Caule et al. A refractory oxide layer formed substantially of aluminum oxide ($Al_2O_3$) may be produced by any desired method. For example, the alloy may be preoxidized by heating to a temperature of between about 330° C. and 820° C. in gases having an extremely low oxygen content such as 4% hydrogen, 96% nitrogen and a trace of water.

Alloy C638 may not be preferred for all packaging applications. The alloy anneals at glass sealing temperatures and the assembled package is subject to distortion and damage due to its softened state. A more preferred alloy is a precipitation hardened alloy suitable for glass sealing such as copper alloy C724.

Alloy C724 consists essentially of from about 10% to about 15% nickel, from about 1% to about 3% aluminum, up to about 1% manganese, from about 0.05% to less than about 0.5% magnesium and the balance copper as disclosed in U.S. Pat. No. 4,434,016 to Saleh et al.

The use of alloy C724 as well as other precipitation hardened alloys for leadframes in glass sealed metal packages is disclosed in U.S. Pat. No. 4,704,626 to Mahulikar which is hereby incorporated by reference in the present application.

Another preferred copper based alloy, C7025, consists essentially of from about 2 to about 4.8 weight percent nickel, from about 0.2 to about 1.4 weight percent silicon, from about 0.05 to about 0.45 weight percent magnesium and the balance copper. Alloy C7025 is disclosed in U.S. Pat. No. 4,594,221 to Caron et al. Alloy C7025 achieves maximum hardness when aged at a temperature of about 450° C. for about 2 hours Precipitation hardenable alloys are referred to as being in the solution treated or homogeneous state when they are single phase Solutionized alloys are rather ductile When the alloys are in the precipitation or age hardened state, they are multi-phase and less ductile. By controlled heating and cooling, an alloy may be transformed from solution treated to age hardened or from age hardened to solution treated.

The glass of the present invention seals at temperatures above 750° C. so a precipitation hardenable leadframe may be glass sealed in the solution treated state, bent to a desired shape, and then age hardened without the properties of the glass being degraded Nothing in the above is intended to limit the package components to precipitation hardened alloys or to a single alloy. For example, the base component 14 may be comprised of oxygen free (OFHC) copper or a dilute copper alloy such as alloy C194 (1.5% – 3.5% iron and small amounts of zinc or mixtures of zinc and phosphorous and the balance copper as disclosed in U.S. Pat. No. 3,522,039 to McLain) or alloy C197 (0.3% – 1.6% iron, 0.01% – 0.20% magnesium, 0.10% – 0.40% phosphorous, up to 0.5% tin or antimony or mixtures thereof and the balance copper as disclosed in U.S. Pat. No. 4,605,532 to Knorr et al.) to increase the dissipation of heat from the electronic device The leadframe 20, the window frame 16 and the cover component 18 may be formed from a precipitation hardenable alloy to give the package 10 extra strength Any desired combination of materials may be employed.

An example of a glass sealed metal package 10 in accordance with the present invention is illustrated in FIG. 1. A base component 14 is formed from a metal or metal alloy. Preferably, a high conductivity alloy such as copper alloy C194 or C197 is utilized. A glass sealable layer 22 may be formed on at least a first surface 15 and, preferably, the edges of the base 14 as well.

The glass sealable layer is preferably a metal oxide or refractory oxide layer and may be applied by cladding. Other additive processes such as plating, sputtering or vapor deposition may also be used If cladding is utilized, the clad is often several mils thick and may be removed from that portion of the base component 14 which will bond to the chip 12 to increase thermal conductivity. If plating, sputtering or vapor deposition is used, the coating is generally much thinner than a clad layer and it is usually not removed from the bonding site.

The glass sealable layer 22 is oxidized to form a refractory oxide 24 on the bonding surface. A sealing glass 26 having a composition in accordance with the present invention is applied to the refractory oxide by any applicable technique. One exemplary technique is to mix the glass powder with a suitable organic solvent such as mixing 10 parts of the glass with 1 part terpinol to form a paste. The paste is applied over a desired portion of the substrate by a technique such as screen printing. The paste is then glazed by heating in a furnace at a temperature of from about 600° C. to about 750° C. in air. Glazing evaporates the solvent from the paste. The glass particles stick to one another by sintering as well as to the oxide surface of the substrate.

After glazing, the parts may be handled gently. Excessive handling may lead to bits of the loosely adherent glass flaking off A similar process provides a window frame 16 with a refractory oxide 28 on at least one surface. The window frame does not contribute significantly to thermal dissipation and is useful to increase the strength of the package. The window frame is preferably a precipitation hardened alloy. A glass 26 with a composition in accordance with the present invention is applied to the refractory oxide layer 28 of the window frame 16 and glazed The glazed base component 14 and the glazed window frame 16 are aligned with a leadframe 20 disposed between the two components. The leadframe is preferably formed from a precipitation hardenable alloy for strength, although a high conductivity copper alloy such as C194 or C197 may be used. To improve the glass to metal bond, it is often desirable to supply a refractory oxide layer to first 19 and second 21 sides of the leadframe 20.

The assembly is fired in a furnace at a temperature of about 750° C. to about 850° C. and, more preferably, at a temperature of from about 740° C. to about 760° C. for a time of about 5 minutes to about 15 minutes and, preferably, of about 5 minutes to about 10 minutes. The furnace atmosphere may be neutral or oxidizing, generally dependent on the composition of the package components. If the components are preoxidized, a neutral or reducing atmosphere, such as 4% $H_2$, 96% $N_2$ may be used. If the components are not preoxidized, a slightly oxidizing atmosphere, such as air or nitrogen with a trace of water may be used.

After sealing, the package assembly contains a leadframe in the solutionized or soft state which is glass sealed to the base and to the window frame components. While the package is hermetic, the leadframe is subject to bending during handling The glass is brittle and subject to moisture penetration In accordance with this invention, the glass sealing system is capable of ceramization. The glass has been specifically designed to undergo ceramization at times and temperatures which age harden the preferred alloys.

The assembly is heated to a temperature of from about 550° C. to about 750° C. for a time of from about 15 minutes to about 90 minutes. A preferred profile for ceramization is to heat in the range of from about 620° C. to about 650° C. for a time of from about 30 minutes to about 60 minutes. A neutral atmosphere such as nitrogen is preferred during ceramization. During ceramization, both the glass and the leadframe undergo a transformation creating a superior electronic package. The nucleating agent precipitates a crystalline ceramic phase. The glass converts to a ceramic and a residual glass matrix. The glass-ceramic comprises from about 10% to about 60% a ceramic and the remainder a glass.

At the same time, the leadframe age hardens by aging The resultant package has improved moisture penetration resistance due to the ceramization and improved resistance to leadframe distortion from age hardening.

Stresses are imparted in the glass-ceramic during ceramization. The stresses are relieved by an optional, but preferred, post-ceramization anneal. The anneal takes place at temperatures of from about 350° C. to about 450° C. and most preferably at a temperature in the range of from about 390° C. to about 420° C. A preferred time for annealing the glass is from about 15 minutes to about 30 minutes. While the glass is being annealed, the annealing cycle serves to further harden the leadframe.

Following ceramization, an electronic device 12 is bonded to the base component by any known die attach system 34. Suitable die attach systems include gold-silicon and lead-tin solders, conductive glasses as well as any other system known in the art. Since the coefficient of thermal expansion of the silicon device 12 is significantly less than the coefficient of thermal expansion of the base component 14, the use of a buffered die attach may be preferred. The buffer system incorporates a low coefficient of thermal expansion buffer, such as tungsten or molybdenum, positioned between the semiconductor device and the metal base component. The glass-ceramic does not deteriorate at die attach temperatures. This is a distinct advantage over conventional sealing glasses which may degrade at temperatures in excess of about 350° C. The electronic device 12 is then electrically connected to lead fingers 35 by a known process such as wire bonding 36.

A cover component 18 is attached to the second surface 40 of the window frame 16 by a suitable bonding component 38. The glass-ceramic is thermally stable at temperatures of up to about 750° C., so the bonding component 38 is selected to have a melting temperature low enough to avoid damage to the electronic device and softening of the precipitation hardened copper alloys. It is preferable to select a bonding component which seals at temperatures less than about 400° C. Most conventional CERDIP bonding components, for example, low temperature solder glasses or alloys such as 80% by weight gold and 20% by weight tin or lead-tin alloys are acceptable.

The second surface 40 of the window frame and the cover component 18 are supplied with a refractory oxide if a solder glass is used as the bonding component 38. If a metallic bonding component is used, it is preferable to have the second surface 40 and cover component 18 bare metal or plated with a metal such as gold or tin to enhance solder wettability The package containing the window frame 16 and cover component 18 with a suitable bonding component 38 disposed therebetween is heated to seal the cover component to the package, thereby completing the hermetic package 10 in accordance with the present invention.

The present invention is not limited to hermetic metal packages as described above. The sealing glass may be used in combination with a metal or any metal alloy in any application where an approximate match in coefficients of thermal expansion is desired.

EXAMPLE 2

Figure 2:
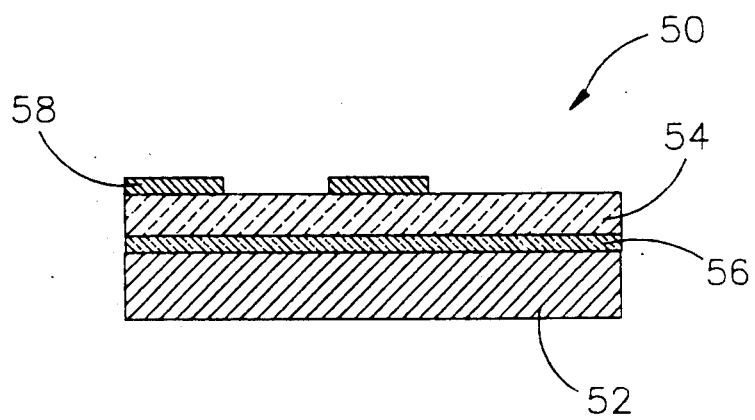
FIG. 2 shows in cross section a glass-metal composite material manufactured in accordance with the invention.

Referring to FIG. 2, a composite 50 is shown in cross section. The composite is comprised of a metal substrate 52 and a glass-ceramic layer 54. Optionally, a glass sealable layer 56 is disposed between the metal substrate and the glass-ceramic layer. The glass sealable layer may be a metal oxide or a refractory oxide as described hereinabove and may be applied by in situ or additive techniques.

The process of assembly is similar to that used for the electronic package. The glass is glazed to the substrate and then bonded by firing at the sealing temperature. After bonding, the glass is ceramized to form the composite. An optional anneal reduces stresses developed within the composite.

The composite may be used to fabricate a circuit assembly such as a printed circuit board or a chip carrier A circuit assembly is disclosed in U.S. Pat. No. 4,491,622 to Butt. A conductive layer such as a metal foil layer 58 may be bonded to the glass as disclosed in U.S. Pat. No. 4,712,161 to Pryor et al. Since the glass-ceramic has a coefficient of thermal expansion approximately equal to that of copper, a copper or copper alloy substrate may be used to take advantage of the high thermal conductivity of the copper. The increased strength and moisture penetration resistance of the glass-ceramic over conventional sealing glasses permits the manufacture of metal boards which are less prone to flexure glass fracture.

EXAMPLE 3

Figure 3:
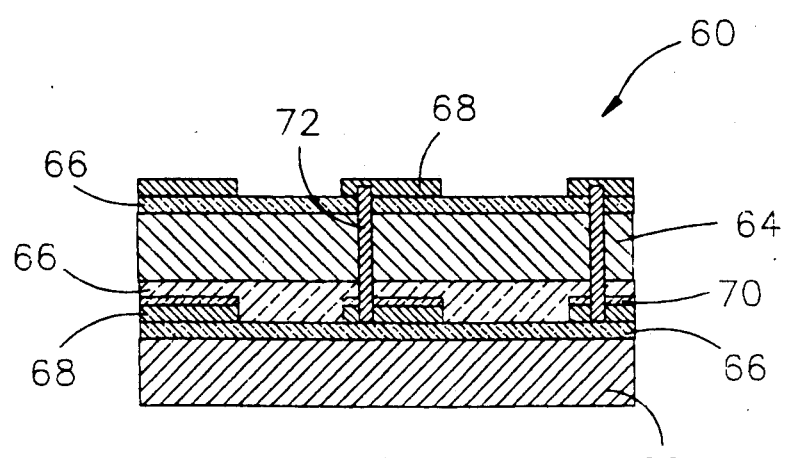
FIG. 3 shows in cross section a multi-layer circuit manufactured in accordance with the invention.

As shown in FIG. 3, the glass-ceramic sealing system may be used to bond a plurality of substrates in the manufacture of multi-layer circuits. A multi-layer circuit board 60 is comprised of first 62 and second 64 substrates. The substrates are any metal or metal alloy and, preferably, copper or a copper alloy. The sealing glass 66 is applied to at least one surface of each substrate as disclosed above and a conductive layer 68 such as copper foil 68 is added. It may be desirable to provide glass sealable layers 70 to the substrate and foil to facilitate glass sealing. The substrates are then stacked and bonded together.

The copper foil layers 68 are formed into circuit patterns, for example, by selectively applying a resist and then chemically etching away the uncovered portions of foil. Insulated conductive through-holes 72 may also be provided to supply electrical contact from one foil layer to the next.

Since the coefficient of thermal expansion of the glass, substrates and foil layers closely match, the multi-layer circuit is not limited to two layers as shown in FIG. 3. Any number of substrates and foil layers may be used with through-hole supplying electrical interconnection. After the multi-layer board has been assembled, ceramization of the sealing glass significantly improves the strength and moisture resistance of the multi-layer circuit.

The glass-ceramic is also useful as a component in a decorative laminate. The glass limits oxidation and corrosion of the underlying substrate. Prior to ceramization, the glass is transparent and the underlying substrate is visible. Following ceramization, the glass-ceramic is opaque white and may serve as a coloring enamel. Examples of decorative composite material formed from a metallic substrate and a glass layer may be found in U.S. Pat. Nos. 3,826,627 and 3,826,629 both to Pryor et al. The laminate is useful for plumbing fixtures, bathroom fixtures or jewelry or other uses for an enameled metal. The coefficient of thermal expansion of a composite manufactured according to the present invention is close to that of copper or a copper alloy. Any application requiring enameled copper could preferably be made using the present glass and a copper or copper alloy substrate.

The advantages of a glass with a coefficient of thermal expansion which matches that of copper or a copper based alloy is not limited to electronic and decorative applications. Any matched seal between glass and a high expansion alloy is improved by the use of the glass of the present invention.

A useful application is matched glass to metal seals in vacuum devices. These devices may be used for electrical devices as disclosed in U.S. Pat. No. 2,446,277 to Gordon or in pressurized vessels requiring glass to metal seals such as a chemical reaction chamber or even a submarine. The vessel need not be under vacuum, it may be pressurized or at atmospheric pressure.

The patents and patent applications set forth in this application are intended to be incorporated in their entireties by reference herein.

It is apparent there has been provided in accordance with this invention a glass-ceramic sealing system suitable for the assembly of hermetic metal packages. The packages so produced have improved strength and moisture penetration resistance. The glass-ceramic sealing system satisfies the objects means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

I claim:

1. A sealing glass having a coefficient of thermal expansion of from about 160 to $180 \times 10^{-7}/°$ C. capable of ceramization, consisting essentially of:
   from about 40 to about 50 molar percent $SiO_2$;
   from about 10 to about 20 molar percent BaO;
   from about 6 to about 9 molar percent $Li_2O$;
   from about 18 to about 22 molar percent $K_2O$;
   from about 0.1 molar percent to about 5 molar percent of a nucleating agent;
   up to about 15 molar percent ZnO;
   up to about 6 molar percent PbO;
   up to about 5 molar percent $Al_2O_3$; and
   up to about 10 molar percent of an additive selected from the group consisting of $B_2O_3$, CaO, NiO, $TiO_2$, SrO and combinations thereof.

2. The sealing glass of claim 1 wherein said nucleating agent is selected from the group consisting of $V_2O_5$ and $P_2O_5$.

3. The sealing glass of claim 2 wherein the concentration of said $SiO_2$ is from about 45 molar percent to about 48 molar percent.

4. The sealing glass of claim 2 wherein the concentration of said BaO component is from about 12 molar percent to about 15 molar percent.

5. The sealing glass of claim 1 wherein said $V_2O_5$ concentration is from about 0.3 molar percent to about 0.8 molar percent.

6. The sealing glass of claim 2 wherein said PbO concentration is from about 4 molar percent to about 6 molar percent.

7. The sealing glass of claim 1 wherein said ZnO concentration is from about 6 molar percent to about 8 molar percent.

8. The sealing glass of claim 1 wherein said $Al_2O_3$ concentration is from about 1 molar percent to about 3 molar percent.

9. The sealing glass of claim 2, consisting essentially of:
   from about 45 molar percent to about 48 molar percent $SiO_2$;
   from about 12 molar percent to about 15 molar percent BaO;
   from about 6 molar percent to about 9 molar percent $Li_2O$;
   from about 18 molar percent to about 22 molar percent $K_2O$;
   from about 0.3 molar percent to about 0.8 molar percent $V_2O_5$;
   from about 4 molar percent to about 6 molar percent PbO;
   from about 6 molar percent to about 8 molar percent ZnO; and
   from about 1 molar percent to about 3 molar percent $Al_2O_3$;

10. The sealing glass of claim 1 wherein said PbO concentration is an amount effective to cause said sealing glass to melt at a temperature of from about 780° C. to about 850° C.

* * * * *